(12) United States Patent  (10) Patent No.: US 8,253,366 B2
Emoto  (45) Date of Patent: Aug. 28, 2012

(54) SIGNAL STATUS DIAGNOSING DEVICE FOR CONTROL ACTUATOR AS DRIVEN OBJECT

(75) Inventor: Hideaki Emoto, Nagasaki (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 148 days.

(21) Appl. No.: 12/674,301

(22) PCT Filed: Jan. 9, 2009

(86) PCT No.: PCT/JP2009/050599
§ 371 (c)(1),
(2), (4) Date: Apr. 7, 2010

(87) PCT Pub. No.: WO2009/088101
PCT Pub. Date: Jul. 16, 2009

(65) Prior Publication Data
US 2011/0121771 A1    May 26, 2011

(30) Foreign Application Priority Data
Jan. 11, 2008 (JP) ................................ 2008-005075

(51) Int. Cl.
*H02P 7/00* (2006.01)
*H02P 3/18* (2006.01)
*H02P 23/00* (2006.01)
*G01R 19/00* (2006.01)
*G01R 15/18* (2006.01)
*H01F 27/28* (2006.01)
*H02M 3/335* (2006.01)

(52) U.S. Cl. ..... 318/490; 318/729; 318/811; 324/76.11; 324/127; 336/220; 363/20

(58) Field of Classification Search ................. 318/490, 318/729, 811; 324/76.11, 127; 336/220; 363/20
See application file for complete search history.

(56) References Cited

U.S. PATENT DOCUMENTS

| 5,519,300 | A | * | 5/1996 | Leon et al. | 318/729 |
| 5,705,989 | A | * | 1/1998 | Cota et al. | 340/660 |
| 6,064,172 | A | * | 5/2000 | Kuznetsov | 318/716 |
| 2002/0053858 | A1 | | 5/2002 | Hayashi et al. | |

(Continued)

FOREIGN PATENT DOCUMENTS

JP    H08-005708    1/1996

(Continued)

*Primary Examiner* — Bentsu Ro
*Assistant Examiner* — Gabriel Agared
(74) *Attorney, Agent, or Firm* — Manabu Kanesaka; Kenneth M. Berner; Benjamin J. Hauptman

(57) ABSTRACT

A device for diagnosing signal status of a driven object includes an insulation transformer, a signal generating device, a current measuring device, a feedback device, and a voltage measuring device. The insulation transformer has an intermediate tap at a midpoint of its primary winding. The signal generating device generates periodically vibrating voltage and includes a rectangular wave pulse voltage and alternating voltage. The current measuring device is connected to the intermediate tap of the primary winding to measure a current. The feedback device converts the current flowing from the intermediate tap of the primary side to a voltage corresponding to the drive voltage and feeds back the converted voltage to the input drive voltage signal. The voltage measuring device measures the voltage added with the feedback voltage. Diagnosis of the signal state is performed based on measurement results of the current measuring device and voltage measuring device.

1 Claim, 5 Drawing Sheets

U.S. PATENT DOCUMENTS

2008/0252246 A1 * 10/2008 Ehlich et al. .................. 318/490

FOREIGN PATENT DOCUMENTS

| | | |
|---|---|---|
| JP | U3083460 | 11/2001 |
| JP | 2002-176788 | 6/2002 |
| JP | 2003-259545 | 9/2003 |
| JP | 2004-198302 | 7/2004 |
| JP | 2006-023105 | 1/2006 |
| JP | 2007-209082 | 8/2007 |

* cited by examiner

Fig. 5A

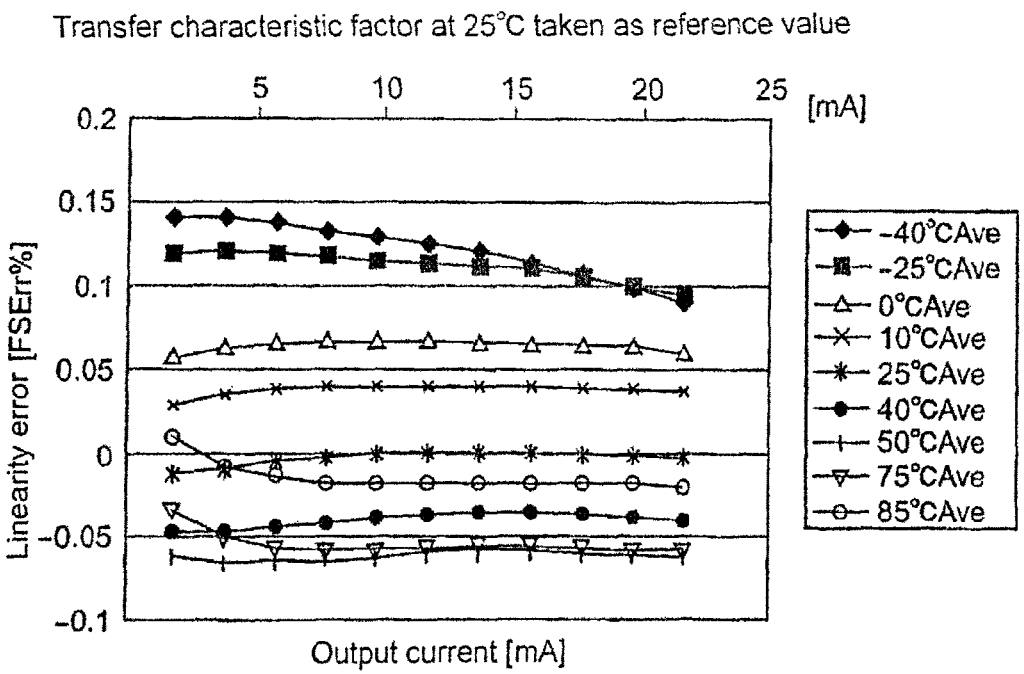

Transfer characteristic factor at 25°C taken as reference value

Fig. 5B

| Core material | | | PC95 |
|---|---|---|---|
| | Maker | Maker | TDK |
| | Initial permeability | $\mu i$ | 3300 |
| | Amplitude permeability | $\mu a$ | - |
| | Unit core loss | Pcv [kW/m³] | 290/@100°C |
| | Saturation magnetic flux density | Bs [nT] | 410 |
| | Residual magnetic flux density | Br [nT] | 60 |
| | Coersive force | Hc [A/m] | 6.5 |
| Core size | | | EE8 |
| | Core constant | C1 [nm⁻¹] | 2.75 |
| | Effective cross section | Ae [nm²] | 7 |
| | Effective magnetic path | Le [nm] | 19.2 |
| | Effective volume | Ve [nm³] | 134 |
| | AL value (without gap) | AL [nH/N²] | 610 |
| Type of winding frame | | | BE8-116CPHFR |
| | Cross section of widing | Aw [nm²] | 5.3 |
| | Average length of widing | Lw [nm] | 19.9 |
| | Width of widing frame | C [nm] | |
| | Number of pins | | 6 |

| | | Volume number | Peak voltage | Average voltage |
|---|---|---|---|---|
| Primary winding | P1 | 44 | 0.12 | 0.08 |
| | P2 | 44 | 0.12 | 0.08 |
| Secondary winding | S1 | 110 | 0.05 | 0.03 |

SIGNAL STATUS DIAGNOSING DEVICE FOR CONTROL ACTUATOR AS DRIVEN OBJECT

RELATED APPLICATIONS

The present application is based on, International Application No. PCT/JP2009/050599, filed Jan. 9, 2009, and claims priority from, Japanese Application Number 2008-005075, filed Jan. 11, 2008, the disclosure of which is hereby incorporated by reference herein in its entirety.

TECHNICAL FIELD

The present invention relates to a device for diagnosing signal status of a control actuator as a driven object, specifically for diagnosing whether a voltage signal sent to a control actuator which is a driven object such as a servo valve which is opened or closed upon receiving the signal or controlled between full opened and full closed state in accordance with the signal for the purpose of controlling a plant or equipment, is transmitted to the driven object accurately and whether there is a braking of wire or short circuit occurred.

BACKGROUND ART

There have been known a control actuator such as a servo valve which is opened or closed upon receiving a voltage signal or controlled between full opened and full closed state in accordance with the voltage signal used in a plant or equipment as a control means. In such a control actuator, an instruction side to send instruction to the plant or equipment is insulated from a side performing measurement or driving or controlling in the plant side (hereafter referred to as the plant side) depending on use for the purpose of preventing affections of signal voltage on the human body or evading affections of noise. This is generally done by adopting an insulation transformer to transform the voltage of electric power from the power source or by insulating a instruction signal sent from the instruction side to plant side from a signal of control result sent from the plant side to the instruction side by means of an insulation transformer, insulation amplifier, etc.

In recent years, there has been an increased demand for performing soundness diagnosis of circuit in the field of instrumentation and measurement for the purpose of raising reliability of the system by confirming soundness of output signals and circuit wiring, that is, by confirming whether instruction signals are transmitted accurate to the control means and whether there is a breaking of wire or short circuit occurred in the circuit.

FIG. 6 and FIG. 7 respectively show an example of conventional drive circuit of a control actuator and that added with a circuit for diagnosing soundness of the drive circuit. In the figures, reference numeral 101 is an electric power source circuit consisting of an electric power source 102, a pulse generating circuit 103, an insulation transformer 104, a rectifying circuit 105, and a constant voltage circuit 106. A broken line 107 indicates an insulation barrier for insulating the instruction side from the plant side.

First, in a circuit in which soundness diagnosing is not performed as shown in FIG. 6, drive voltage signal 131 of 1.5V, for example, for driving an actuator 130 is modulated into an alternating signal by a modulating circuit 132, amplified by an insulation transformer 133 which is a signal insulation means provided to insulate the plant side from the instruction side, then demodulated by a demodulating circuit 134 supplied with electric power from the electric power source circuit 101, converted by a signal conversion circuit 135 to driving electric power of for example 25V, 4~20 mmA, and supplied to a driven object 130 such as an actuator, the driven object.

However, with the circuit shown in FIG. 6, a signal of what voltage and current is sent to the actuator which is an object to drive can not be known, and further, although the signal is insulated and sent to the actuator 130, whether the actuator 130 is working normally and whether there is a breaking of wire or short circuit in the wiring to the actuator 130, can not be known.

In a circuit added with a circuit to diagnose the soundness thereof as shown in FIG. 7, the driving voltage signal 131 for driving the actuator 130 which is the driven object is modulated into an alternating signal by the modulating circuit 132 similarly as in FIG. 6, amplified by the insulation transformer 133, demodulated by the demodulating circuit 134, converted by the signal conversion circuit 135 into a voltage signal or current signal corresponding to the driving voltage signal 131 to drive the actuator 130.

In order to confirm the operation of the actuator 130, the driven object, there are provided signal conversion circuits 136a (for current signal) and 136b (for voltage signal) for converting the voltage and current supplied to the actuator 130 from the signal conversion circuit 135, which is supplied with electric power from the electric power source circuit 101, into an alternating signal respectively so as to be able to be inputted to insulation transformers 138a and 138b respectively; modulating circuits 137a and 137b for modulating the outputs from the signal conversion circuits 136a and 136b; and further demodulating circuit 139a and 139b for demodulating the voltages transformed by the insulation transformers 138a and 138b into a current signal and voltage signal. With this circuit configuration, whether operation is performed in accordance with the instruction and whether there is a breaking of wire or short circuit are judged according to whether current is flowing to the actuator 130 and whether the applied voltage is a voltage corresponding to actuation of the actuator 130.

As mentioned above, in the conventional circuit, insulation electric power source circuit 101 including the insulation transformer 104 and constant voltage circuit 106, and an insulation means such as an insulation amplifier composed including the insulation transformer 133 to insulate signals between the plant side and instruction side, are used in order to drive the actuator 130 (driven object) or to drive the signal conversion circuit, modulating circuit, and demodulating circuit. Insulated interface of the instruction side and plant side has been attained in this way. Therefore, in the conventional circuit, an insulation electric power source circuit and insulation amplifiers are needed, which results in a large increase in cost.

In the circumstances, the circuit like this has been able to afford to be applied only in a special case where confirmation of reliability is demanded in spite of increase in cost, because when performing such a soundness diagnosis that whether voltage signals used in controlling the plant and equipment are transmitted accurately and whether there is a braking of wire or short circuit, additional insulation amplifiers are needed to carry out give-and-take of signals between the plant side and instruction side, which requires a large increase of cost.

When performing the soundness diagnosis that whether voltage signals used in controlling the plant and equipment are transmitted accurately and whether there is a braking of wire or short circuit, there occur following problems:

(A) Transmission of signals and supply of electric power must be done by separate circuits.

(B) A modulation circuit and demodulation circuit are needed in order to transmit DC signals via an insulation transformer.

(C) It is required to convert current signals to voltage signals because signal transmission is performed by voltage signals.

To suffice item (A), it is needed to provide insulation circuits both to the electric power source side and signal transmission side, to suffice item (B), it is needed to provide modulation circuits and demodulation circuits to the signal transmission side, and to suffice item (C), it is needed to provide signal conversion circuits.

As to the art for detect braking of wire, there are disclosed for example in patent literature 1 (Japanese Laid-Open Patent Application No. 2006-023105) a method of detecting breaking of wire by applying a pulse signal to the wire, and comparing the current wave shape measured with the reference current wave shape to judge the presence or absence of breaking of wire from difference in both the wave shapes, and in patent literature 2 (Japanese Laid-Open Patent Application No. 2004-198302) a circuit for detecting breaking of wire by applying a pulse signal for checking via an impedance component to the signal wire for detecting breaking of wire, and comparing the signal obtained from the signal wire with the pulse signal for checking to judge the presence or absence of breaking of wire.

As to diagnosis of electric circuits, there is disclosed for example in patent literature 3 (Japanese Laid-Open Patent Application No. 8-005708) a method of diagnosing electric circuits and diagnosing device used for the method. With which conditions of electric apparatuses are diagnosed for the purpose of improving efficiency of diagnosis operation by facilitating measurement record management and further decreasing occurrence of man-caused errors, by reading out information written and stored in a nonvolatile memory concerning measurement results of characteristics or things concerning measurement of the electric apparatuses, or measurement results of characteristics or things concerning measurement of the electric apparatuses, and comparing the read-out information with the information of-the-moment concerning measurement results of characteristics or things concerning measurement of the electric apparatuses.

However, with the art taught in the patent literature 1 and 2, means for applying pulse signals and a memory for memorizing reference current wave shape are needed, and with the electric circuit diagnosing device disclosed in the patent literature 3, a memory memorized information concerning measurement results of characteristics or things concerning measurement of the electric apparatuses is needed, and further a means for measuring characteristics of the circuit and a means, for comparing the measurement result with the reference data, resulting in complicated composition. Therefore, problems cited in the items (A)~(C) can not be solved by these art.

SUMMARY OF THE INVENTION

Therefore, the object of the present invention is to provide a device for diagnosing signal status of a driven object, with which a signal showing the status of a signal given to a control actuator, a driven object, or occurrence of a breaking of wire or short circuit, is transmitted by the same means for transmitting the electric power, and transmission of measurement result and diagnosis of soundness of the circuit can be performed with high accuracy by simple construction without increase of the number of parts and complication of the circuitry, thereby preventing increase in manufacturing cost.

To attain the object, the present invention proposes a device for diagnosing signal status of a driven object, in which a drive voltage signal for driving the driven object is inputted via an insulation means, the driven object is driven by electric drive power corresponding to the inputted voltage, and concurrently signal status of the driven object is diagnosed, wherein the device comprising: an insulation transformer having an intermediate tap at a midpoint of its primary winding as said insulation means, to the secondary side of which is connected said driven object, a signal generating means for generating periodically vibrating voltage including a rectangular wave pulse voltage (switching pulse voltage vibrating between 0V and a positive voltage or a negative voltage) and alternating voltage (voltage vibrating between a positive voltage and a negative voltage) having an amplitude corresponding to that of said inputted drive voltage signal for driving the driven object connected to the primary side of the insulation transformer, a current measuring means connected to the intermediate tap of the primary winding of the insulation transformer to measure a current generated in the primary side caused by the current flowing in the driven object connected to the secondary side of the insulation transformer, a feedback means for converting the current flowing from the intermediate tap of the primary side to a voltage corresponding to the drive voltage driving the driven object and feeding back the converted voltage to the input drive voltage signal, and a voltage measuring means for measuring the voltage added with the feedback voltage, whereby diagnosis of signal state of the driven object is performed based on measurement results of the current measuring means and voltage measuring means.

In this way, by measuring the change of the primary side voltage caused by the consumption of the electric power supplied from the primary side by the driven object connected to the secondary side of the insulation transformer, converting the measured change of current into a voltage corresponding to the voltage driving the driven object and feeding back the converted voltage to the inputted drive voltage, measuring the voltage added with the feedback voltage, and diagnosing the signal status of the driven object based on the measurement results of the current and voltage, transmission of measurement result and diagnosis of soundness of the circuit can be performed with high accuracy by simple construction without increase of the number of parts and complication of the circuitry, thereby preventing increase in manufacturing cost.

As has been described heretofore, the device for diagnosing signal status of a control actuator according to the invention can be composed in very simple construction without increasing the number of parts and complicating the circuitry, with a result that increase of manufacturing cost is prevented. In addition, with the device, transmission of measurement result and diagnosis of the soundness of the circuit can be performed with high accuracy without the need to provide an electric power source having a constant voltage circuit, insulation means such as an insulation transformer for both the electric power source side and signal transmitting side, signal conversion circuit, modulating circuit, and demodulating circuit.

BRIEF DESCRIPTION OF THE DRAWINGS

FIG. 5A is a graph of a test result showing linearity error of transfer characteristic of the transformer used in the invention (linearity error for various core temperature between −40~85° C. taking the transfer characterization factor at 25° C. as the reference value), and FIG. 5B is table showing the specifications of the transformer used in the test.

DETAILED DESCRIPTION OF THE PREFERRED EMBODIMENTS

A preferred embodiment of the present invention will now be detailed with reference to the accompanying drawings. It is intended, however, that unless particularly specified, dimensions, materials, relative positions and so forth of the constituent parts in the embodiments shall be interpreted as illustrative only not as limitative of the scope of the present invention.

Figure 1:
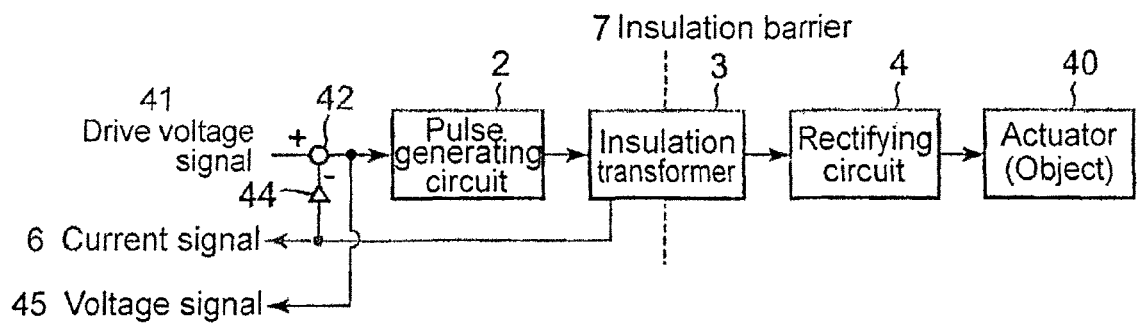
FIG. 1 is a block diagram of circuit according to the invention for driving a control actuator such as a servo valve which is fully opened or fully closed upon receiving voltage signal, or a servo valve of which opening is controlled between fully opened state and fully closed state in accordance with the voltage of a voltage signal.
Figure 2:
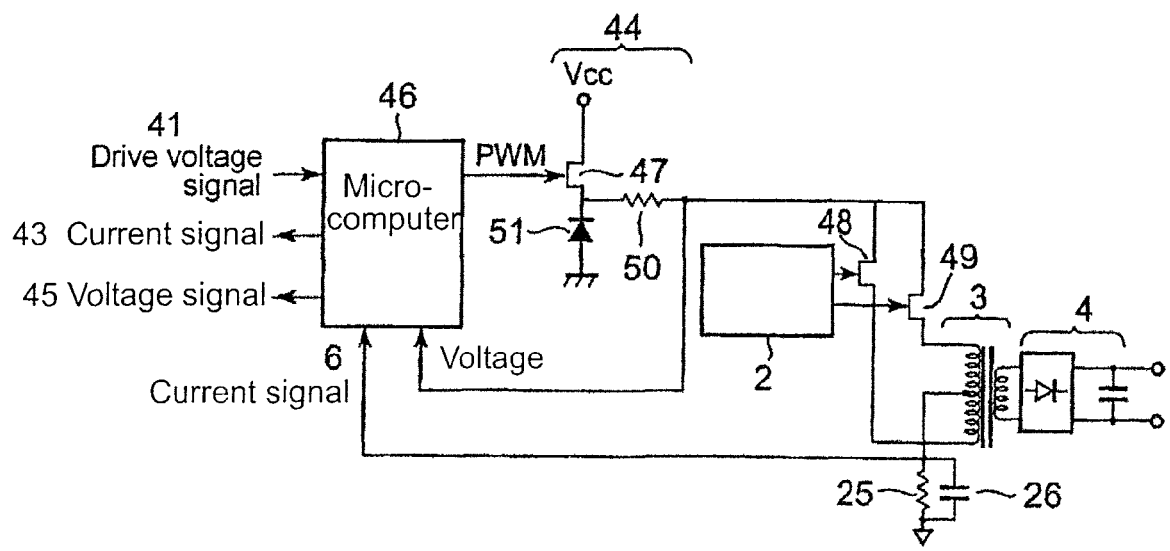
FIG. 2 is a diagram of a circuitry according to the invention for driving the control actuator of FIG. 1.
Figure 6:
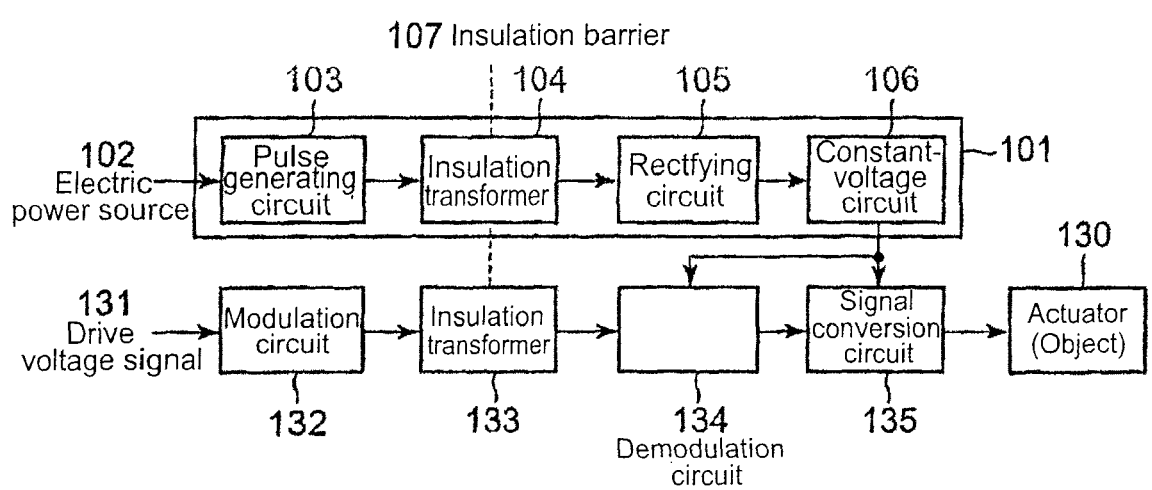
FIG. 6 is a block diagram of a conventional circuit for driving an actuator such as an electromagnetic valve which is fully opened or fully closed upon receiving voltage signal, or a servo valve of which opening is controlled between fully opened state and fully closed state in accordance with the voltage of a voltage signal.
Figure 7:
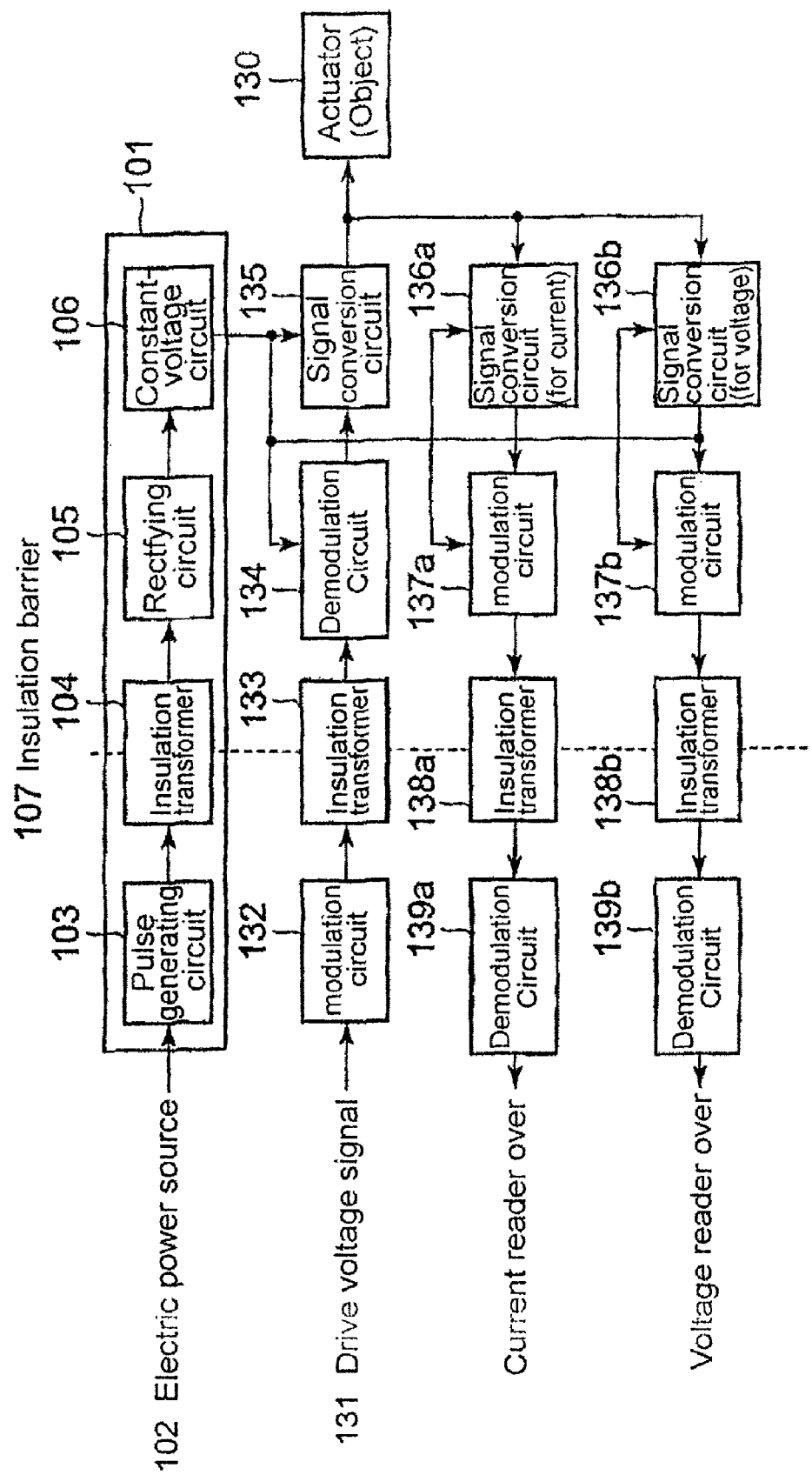
FIG. 7 is a block diagram of a conventional circuit for driving an actuator such as an electromagnetic valve which is fully opened or fully closed upon receiving voltage signal, or a servo valve of which opening is controlled between fully opened state and fully closed state in accordance with the voltage of a voltage signal.

FIG. 1 and FIG. 2 is respectively a block diagram and circuitry according to the invention applied to a control actuator such as a servo valve of which the opening is controlled between fully opened state and fully closed state in accordance with the voltage of a voltage signal as explained referring to FIGS. 6 and 7 of a conventional circuit. In FIGS. 1 and 2, reference numeral 2 is a pulse generating circuit, 3 is an insulation transformer, 4 is a rectifying circuit, 6 is a current signal flowing in the primary side of the insulation transformer 3, and a broken line 7 indicates an insulation barrier. Reference numeral 25, 26 is respectively a resistance and a condenser for measuring current, 40 is a control actuator as a driven object, 41 is a drive voltage signal for driving the control actuator 40, 42 is an adder, 43 is a current signal of measurement result.

Reference numeral 44 is an amplifier which converts the current signal 6 as follows:
  (a) when the control actuator is operating normally, converts it into 0 volt, and
  (b) when excessively large current flows or breaking of wire
or short-circuit occurs in the circuit, converts the primary side current 6 corresponding to the secondary side current of the insulation transformer into a voltage corresponding to the excessively large current or corresponding to the occurrence of breaking of wire or short-circuit.

Reference numeral 45 is a voltage signal for diagnosing whether a voltage corresponding to the drive voltage signal 41 is applied to the control actuator 40 or not, 46 is a control microcomputer for controlling the adder 42 and amplifier 44 in FIG. 1. Reference numeral 47, 48, and 49 is a FET (Field Effect Transistor), 50 is an inductor, and 51 is a diode.

First, referring to the block diagram of FIG. 1, the drive voltage signal 41 which is a command signal to determine a current to be applied to the actuator 40, a driven object, is applied to the pulse generating circuit 2. The pulse generating circuit 2 generates a pulse of an amplitude corresponding to the drive voltage signal 41. The pulse generated by the pulse generating circuit 2 is preferably a rectangular wave but an alternating wave such as a sine curve is also permissible. A voltage increased in electric pressure corresponding to the drive voltage signal 41 is outputted from the secondary side of the insulation transformer 3, the output voltage is rectified by the rectifying circuit 4 and sent to the control actuator 40 to drive it. As a current corresponding to the electric power consumed by the control actuator 40 flows in the primary side of the insulation transformer 3, this current as the current signal 6 is converted by the amplifier 44 into voltage according to the case (a) or (b) as described above, the converted voltage is given as feedback to the drive voltage signal 41 via the adder 42, the resultant voltage of the feedback is outputted as the applying voltage signal 45 of the insulation transformer 3.

That is, in the diagnosing device of signal status of the control actuator (driven object 40), electric power is consumed as electric current flows in the control actuator 40, a current corresponding to said current flows in the primary side of the insulation transformer 3, so this current of the primary side is measured and the current and voltage flowed or consumed in the control actuator 40 is estimated based on the measurement result. When there occurs a short circuit, the voltage signal is measured as a small voltage, and when is a breaking of wire, the voltage signal is measured as a large voltage, so whether connection to the actuator 40 is normal or not can be known, and the signal status including soundness diagnosis of the connection of the actuator can be recognized.

Next, FIG. 2 which is a concrete circuitry of FIG. 1 which is a block diagram will be explained. The actuator 40 is connected to the full-wave rectifying circuit 4 connected to the secondary side of the insulation transformer 3. To the control microcomputer 46 which is provided in the primary side of the insulation transformer 3 and performs the function of the adder 42 and amplifier 44 shown in the block diagram of FIG. 1 is inputted the drive voltage signal 41, applied with a voltage corresponding to the drive voltage signal 41 outputted from the circuit consisting of the FET 47, diode 51, and inductor 50 supplied with a voltage $V_{cc}$ supplied. The FET 48 and FET 49 for applying, driven by the pulse generating circuit 2, a voltage from the FET 47 alternately to both ends of the primary winding of the insulation transformer 3 are provided.

As an intermediate tap is provided to the primary winding of the insulation transformer 3, and a voltage is applied to both the ends of the primary winding of the insulation transformer 3 alternately by the FET's 48 and 49, a current flows through the circuit consisting of the resistance 25 and condenser 26. This current is sent to the control microcomputer 46 as the current signal 6 to be outputted as the current signal 43 and at the same time converted as mentioned before depending on situations as follows:
  (a) when the control actuator is operating normally, converted into 0 volt, and
  (b) when excessively large current flows or breaking of wire
or short-circuit occurs in the circuit, converted into a voltage corresponding to the excessively large current or corresponding to the occurrence of breaking of wire or short-circuit. The converted value is given as feedback to the drive voltage signal 41, and the result is added to the voltage applied to insulation transformer 3 from the inductor 50 via the FET 48, 49 to obtain the voltage signal 45.

In the circuit configured like this, a PWM (Pulse Width Modulation) signal is applied to the FET from the microcomputer 46 to which the drive voltage signal 41 is imputed so that a driving signal of the actuator 40 becomes a signal corresponding to the voltage of the drive voltage signal 41. For that purpose, a voltage corresponding to the voltage of the drive voltage signal 41 is applied from the FET 47 to the FET's 48 and 49 to which the pulse is supplied from the pulse generating circuit 2. Therefore, a voltage increased in electric pressure to correspond to the drive voltage signal 41 is outputted from the secondary side of the insulation transformer 3 to be sent via the rectifying circuit 4 to the control actuator 40 which is not shown in FIG. 2 to drive it.

As a current corresponding to the current flowing to the control actuator 40 flows in the primary winding of the insulation transformer, the primary side current 6 flowing from the intermediate tap through the resistance and condenser 26 is inputted to the control microcomputer 46, and the primary side current 6 is converted into a voltage depending on the situations (a) or (b) as described above, and the converted voltage is added via the inductor 50 to the measured voltage to obtain the voltage signal 45.

To be more specific, when the actuator 40 is operating normally, the primary side current signal 6 corresponds to the electric power consumed by the control actuator 40, so, by converting the current signal 6 to a 0V signal according to the case (a), the voltage signal 45 of the same voltage value as the voltage signal 41 is outputted. The voltage applied to the control actuator 40, the driven object, can be estimated by knowing the value of the voltage signal 45 and current signal 6, so whether the control actuator is working normally or not can be judged. Further, the resistance of the control actuator 40 can be known, so, by converting the primary side current 6 into a voltage corresponding to a malfunction of the circuit according to the case (b), the voltage of the signal is measured as a small voltage value when there is a short circuit and measured as a large voltage value when there is a breaking of wire. In this way, excess current flow to the control actuator 40, occurrence of braking of wire or short circuit, can be estimated by knowing the value of the current signal 6 and voltage signal 45.

Therefore, a drive circuit can be obtained in which analog signal of current and voltage applied to the control actuator 40 can be transmitted to the instruction side with high accuracy without providing as shown in FIG. 6 the modulating circuit 132, insulation transformer 133 demodulating circuit 134, and signal conversion circuit 135. Further, a circuit provided with a circuit soundness diagnosing device can be composed in a simple circuit without providing as shown in FIG. 7 the insulation amplifier comprising the signal conversion circuits 136a(for current signal) and 136b (for voltage signal) for converting the voltage and current supplied to the actuator 130 from the signal conversion circuit 135 into an alternating signal respectively so as to be able to be inputted to insulation transformers 138a and 138b respectively; modulating circuits 137a and 137b for modulating the outputs from the signal conversion circuits 136a and 136b; and demodulating circuit 139a and 139b for demodulating the voltages transformed by the insulation transformers 138a and 138b into a current signal and voltage signal; and furthermore inexpensively than the conventional circuit without a circuit soundness diagnosing device as shown in FIG. 6.

When diagnosing the status of the signal of the control actuator, the driven object, via the transformer, that is, when estimating the state of the driven object by measuring the current change generated in the primary side of the transformer caused by the consumption of electric power by the operation of the driven object, using an electric power source not provided with the constant voltage circuit, there arises a problem of accuracy for the measurement of current flowing to the actuator 40 which is a driven object. Particularly, in the circuit system like this, energy loss in the insulation transformer becomes an error for the transmitted energy. When the error in the signal transmission is smaller than a required accuracy range, there is no problem. For example, when error of about 0.2%—0.25% is permissible, conventional transformer can be adopted.

When more precision is required, for example, error must be smaller than 0.1%, change of core loss depending on temperature of the transformer becomes most problematic. However, when the core loss is nearly constant in relation to temperature, it is no matter to judge the measurement result with high accuracy taking temperature into consideration, and measurement and transfer of analog signals is made possible with high accuracy.

Figure 3:
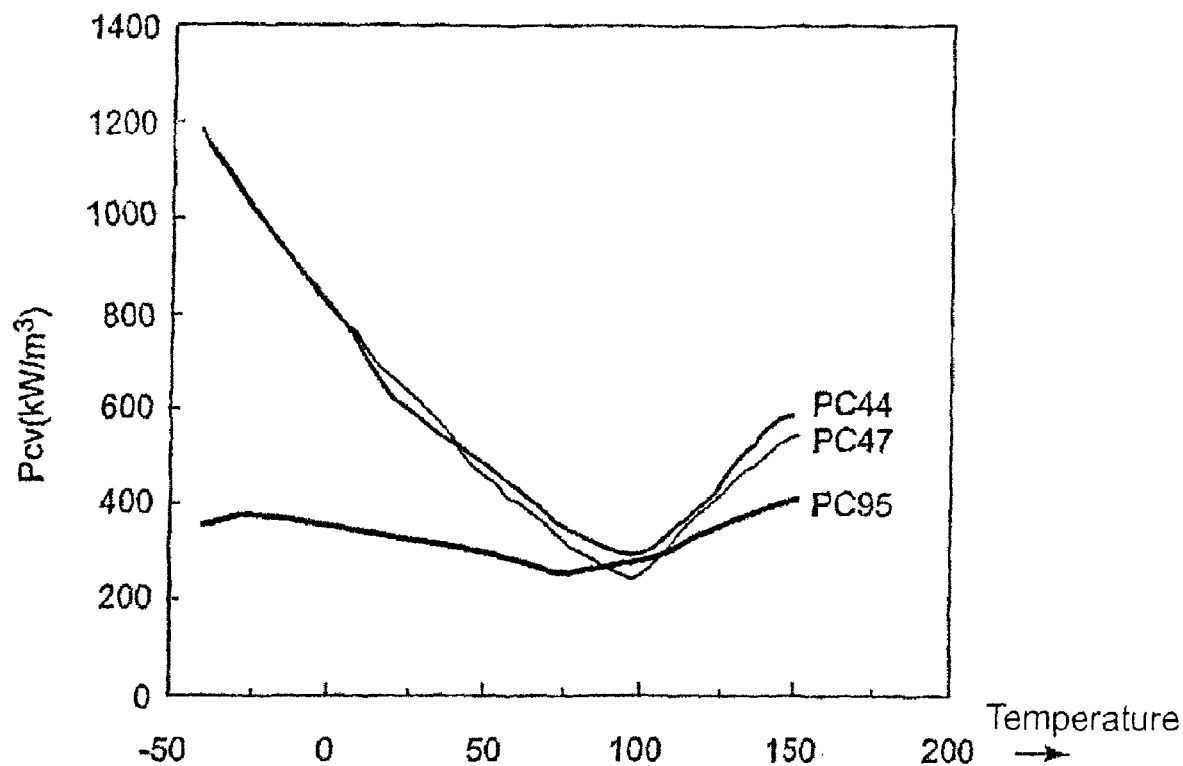
FIG. 3 is a graph showing core loss (electric power loss) vs. temperature characteristic of the core material used in the transformer of the invention.

FIG. 3 is a graph showing core loss characteristic (loss power (kW/cm$^3$) vs. temperature (° C.)) of several core materials. Core materials PC44 and PC47 of TDK Ltd. made which has a peak value at near 100° C., however, PC95 also of TDK Ltd. made has a relatively flat core loss characteristic. In the invention, PC95 was adopted as the core material of the insulation transformer. By this, a signal status diagnosing device can be provided which performs diagnosis of the status of signals in the measurement and control means in the driven object with high accuracy.

Figure 4:
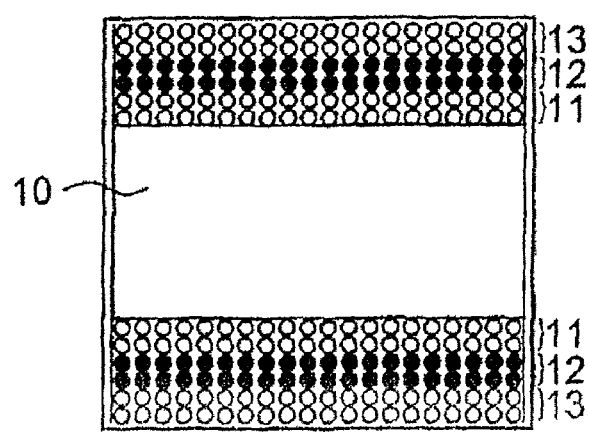
FIG. 4 is a pattern diagram showing winding of the primary and secondary coil around the core of the transformer used in the invention.

Further, the inventors of the application composed a transformer such that an intermediate tap is provided in an intermediate part of the primary winding, a current measuring means is connected to the intermediate tap, and change of primary side current caused by consumption of current supplied to the secondary side. As shown in FIG. 4, the primary coil is divided into an anterior half 11 and posterior half 13 such that a secondary coil 12 is sandwiched by both the primary coil 11 and 13, and the intermediate tap is taken out from the center of the primary coil. The inventors found out that a favorable signal transfer characteristic can be obtained with this composition of a transformer using PC95 as core material.

FIG. 5A is a graph showing a test result. The test was performed composing a distributor-isolation-amplifier using a insulation transformer composed using PC95 of TDK made as core material and arranging primary and secondary windings as shown in FIG. 4. Linearity and temperature drift were measured.

Specification of the insulation transformer used in the test is shown in the table of FIG. 5B. Measurement was performed using a precision resistance of accuracy of 10 ppm/° C.

In FIG. 5A is shown linearity errors of transfer characteristics for temperatures between −40-85° C., in which output currents (mA) of the distributor-isolation-amplifier are plotted as the abscissa and full scale errors % (4~20 mA is taken as 100%) are plotted as the ordinate, with the transfer characteristic factor at 25° C. taken as the reference value.

In the case of the conventional transformer composed by using PC44 or PC47 as core material to have a single primary coil not divided in two as shown in FIG. 4 and a secondary coil wound over the primary coil, linearity is 10.05% or smaller, and about ±0.25% under environment of 0~60° C. Therefore, as can be recognized from FIG. 5A that, by composing the insulation transformer as described before, linearity of ±0.01% or smaller, about ±0.1% under environment of 0~85° C., and about 0.15%~−0.1% under environment of −40~85° C. can be attained. It is thinkable that further improvement in accuracy and temperature characteristic can be attained by innovations in shape and size and increase of the number of winding of the insulation transformer. By adopting the insulation transformer like this, diagnosing of the signal status of the actuator can be performed with high accuracy by simple circuitry.

INDUSTRIAL APPLICABILITY

According to the invention, provision of means for diagnosing signal status of a control actuator, which has been hesitated in the past because of increase in manufacturing cost, can be implemented with simple construction and without increase in the number of constituent elements, complication of the circuit configuration, and increase in manufacturing cost. The invention can be applied easily to an electric circuit which is required particularly to be highly reliable.

The invention claimed is:

1. A device for diagnosing signal status of a driven object, in which a drive voltage signal for driving the driven object is inputted via an insulation means, the driven object is driven by electric drive power corresponding to the inputted voltage, and concurrently signal status of the driven object is diagnosed, wherein the device comprising:

an insulation transformer having an intermediate tap at a midpoint of its primary winding as said insulation means, to the secondary side of which is connected said driven object, a signal generating means for generating periodically vibrating voltage including a rectangular wave pulse voltage and alternating voltage having an amplitude corresponding to that of said inputted drive voltage signal for driving the driven object connected to the primary side of the insulation transformer, a current measuring means connected to the intermediate tap of the primary winding of the insulation transformer to measure a current generated in the primary side caused by the current flowing in the driven object connected to the secondary side of the insulation transformer, a feedback means for converting the current flowing from the intermediate tap of the primary side to a voltage corresponding to the drive voltage driving the driven object and feeding back the converted voltage to the input drive voltage signal, and a voltage measuring means for measuring the voltage added with the feedback voltage, whereby diagnosis of signal state of the driven object is performed based on measurement results of the current measuring means and voltage measuring means.

* * * * *